US012328114B1

(12) United States Patent
Borse

(10) Patent No.: US 12,328,114 B1
(45) Date of Patent: Jun. 10, 2025

(54) NEURON—AN ELECTRONIC CIRCUIT TO CONTROL DIRECTION OF ELECTRICAL DATA SIGNALS

(71) Applicant: Swaresh Borse, Allen, TX (US)

(72) Inventor: Swaresh Borse, Allen, TX (US)

(73) Assignee: Swaresh Borse, Allen, TX (US)

( * ) Notice: Subject to any disclaimer, the term of this patent is extended or adjusted under 35 U.S.C. 154(b) by 77 days.

(21) Appl. No.: 18/531,621

(22) Filed: Dec. 6, 2023

(51) Int. Cl.
*H03K 17/56* (2006.01)
*H03F 3/45* (2006.01)

(52) U.S. Cl.
CPC ......... *H03K 17/56* (2013.01); *H03F 3/45475* (2013.01)

(58) Field of Classification Search
CPC .. H03K 17/56; H03K 17/567; H03F 3/45475; H02M 1/007; H02M 1/008; H02M 3/00; H02M 3/33515; H02M 7/757; H04J 3/047
See application file for complete search history.

(56) References Cited

U.S. PATENT DOCUMENTS 3,132,264 A * 5/1964 Dahme ................. H03K 17/73
365/159

* cited by examiner

*Primary Examiner* — Jung Kim

(57) ABSTRACT

Present invention is an electronic circuit used to control flow of electrical data signal which can be analog or digital, AC or DC. It is built by amalgamating buffer, adder, potential divider, logic inverter, and silicon-controlled rectifier circuits. Electrical paths can be dynamically formed and broken as per system requirement. It offers hardwiring or soft wiring flexibility to make, and break the electrical paths, which are also referred to as channels in this document. The invention can be applied in electrical systems where the electrical data signal's flow needs to be switched from one circuit to another or needs its direction to be reversed. It can also be implemented in electrical circuits that require signal splitting. It can also be embedded into an integrated circuit to provide much smaller footprint.

9 Claims, 4 Drawing Sheets

NEURON—AN ELECTRONIC CIRCUIT TO CONTROL DIRECTION OF ELECTRICAL DATA SIGNALS

CROSS REFERENCE TO RELATED APPLICATIONS

This application does not provide reference to any prior applications.

BACKGROUND OF THE INVENTION

1. Field of Invention

The present invention relates to electrical and electronic systems wherein an application requires diverting electrical data signals in a circuit from one point to another. Said invention can also reverse the direction of electrical data signal flow on a path in a circuit.

2. Description of Related Art

A brain is made up of number of cells called neurons. These neurons have several branches to connect to other neurons and cells. A chemical signal originating inside a brain is carried by said neurons. Of the several branches inside said neuron, one of the branches acts as an incoming path and one of the other branches acts as an outgoing path. Said neuron selects which branch should be incoming and which branch should be outgoing depending on the requirement.

Said invention is inspired by the functioning of said brain cells. Similar to said biologic neurons, said invention has several branches which shall be termed as "nodes" from here on for the rest of this document. Each of the said nodes can be configured to be either an input or output. This can be achieved by hard wiring or through a micro-controller. Said invention can then carry an electrical data signal from input node to output node. With the use of a micro-controller, said invention's nodes can be dynamically configured as input and output nodes.

SUMMARY OF THE INVENTION

The present invention is inspired from brain cells. Selective direction of electrical data signal flow while maintaining integrity of said signal is the main function of said invention. Said electrical data signal can be AC or DC; analog or digital. Said invention is built with operational amplifiers, silicon-controlled rectifiers, resistors, and transistor. It has several nodes, and each node has control pins which are used to set a particular node to function as an input or output. If set as input, an electrical data signal must be incoming into said invention through that node. If set as output, said electrical data signal must be outgoing from said invention through that node. If no nodes are set as input and outputs, said invention will not carry any electrical data signal and will be termed to be in a dead mode.

Said invention can be used in applications that require signal routing or switching. It can also be applied in situations where an electric path requires to conduct electrical data signals in both directions without losing integrity of data carried by the said electrical data signals. It can also be used for splitting data signals onto different paths in a circuit.

DETAILED DESCRIPTION OF INVENTION

Figure 1:
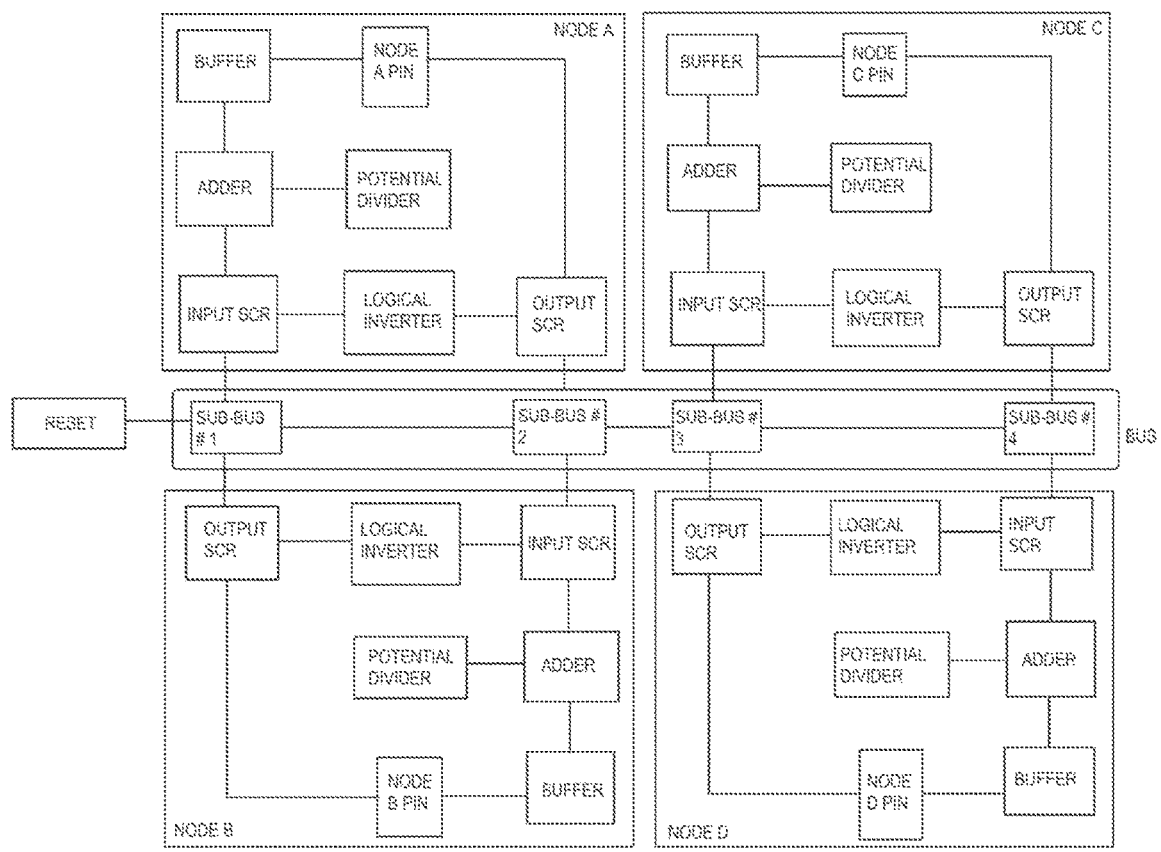
FIG. 1. Block diagram of said invention.
Figure 2:
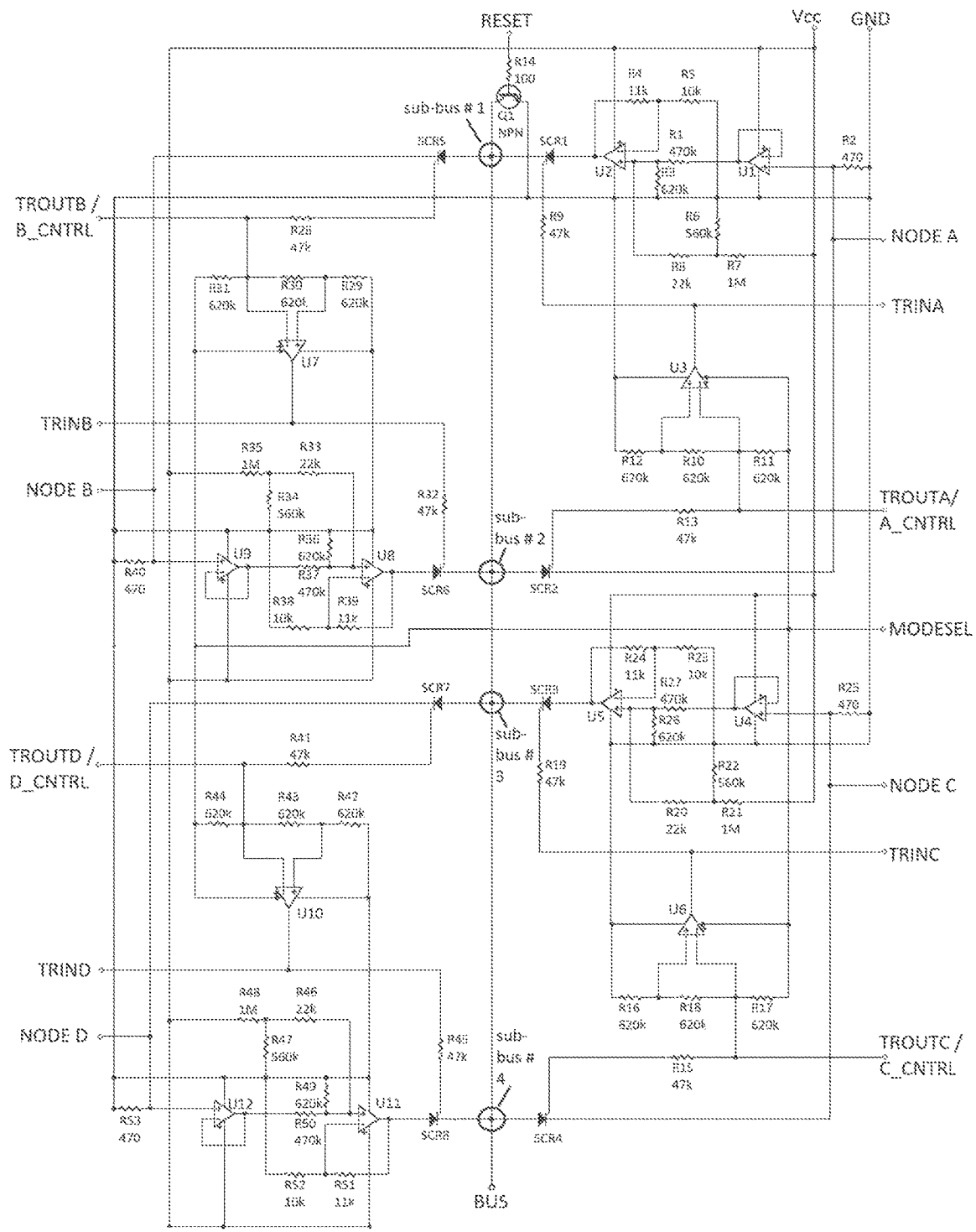
FIG. 2. Circuit diagram of said invention.

FIGS. 1 and 2 of "Invention Drawings" document show a block diagram and circuit diagram of said invention respectively. Present invention is made up of four nodes connected to each other at a common point which will be termed as "bus" from here on in this document. Furthermore, said circuit diagram in FIG. 2 of "Invention Drawings" document shows four different connections between cathode terminal of a silicon-controlled rectifier and anode terminal of another silicon-controlled rectifier. Each of the said connections will be termed as "sub-bus" from here on in this document. These four sub-buses are connected together to form a bus. Said bus is controlled by a transistor of type NPN and is being implemented as an electronic switch. Each node in said invention is built by six sub-systems—a buffer circuit, a potential divider circuit, an adder circuit, an inverter circuit, an input silicon-controlled rectifier (SCR) circuit and an output silicon-controlled rectifier (SCR) circuit.

Each said node can be independently configured to function as an input or an output. A pair of active input-output nodes will be termed as a "channel" from here on in this document. At a given instance in time it is advisable that there be only one input node configured in said invention. If an application requires two or more sources of electrical data signal, then a previously configured channel should be erased and a new channel should be established with the new electrical data signal source.

Said invention's four nodes are labeled as A, B, C and D. All possible channel configurations can be defined as below:
1. One input, one output configuration
   a. Input from A output from B
   b. Input from A output from C
   c. Input from A output from D
   d. Input from B output from A
   e. Input from B output from C
   f. Input from B output from D
   g. Input from C output from A
   h. Input from C output from B
   i. Input from C output from D
   j. Input from D output from A
   k. Input from D output from B
   l. Input from D output from C
2. One input, two output configuration:
   a. Input from A output from B and C
   b. Input from A output from B and D
   c. Input from A output from C and D
   d. Input from B output from A and C
   e. Input from B output from A and D
   f. Input from B output from C and D
   g. Input from C output from A and B
   h. Input from C output from A and D
   i. Input from C output from B and D
   j. Input from D output from A and B
   k. Input from D output from A and C
   l. Input from D output from B and C 3. One input, three output configuration:
    a. Input from A output from B, C and D
    b. Input from B output from A, C and D
    c. Input from C output from A, B and D
    d. Input from D output from A, B and C In all, total 28 channel configurations possible.

Said NPN transistor functions as a switch to erase any created channel. Erasing channel will be termed as "resetting" said invention channels from here on in this document. Before a new channel can be created, previously formed channel needs to be erased. This can be achieved by connecting a positive voltage level or logic '1' to the base pin of said transistor. This base pin is termed as "RESET" pin. When said "RESET" pin is set to logic '1', said bus carries no data signals and hence no channel is present.

Each node has two silicon-controlled rectifiers. One of said silicon-controlled rectifiers enables said node to be configured as an input node. The other silicon-controlled rectifier enables said node to be configured as an output node.

Each node has three electrical contacts which will be termed as "pins" from here on in this document. These three pins are labeled as below:

Note: a variable 'x' is used for node names which can assume any of the value 'A', 'B', 'C' or 'D' from here on in this document.
1. The first pin is called "NODEx". This pin carries the said electrical data signal.
2. The second pin is called "TRINx". This pin is a control pin which when set to logic '1' makes node x an input node.
3. The third pin is called "TROUTx/x_CNTRL". This pin is a control pin which when set to logic '1' makes node x an output node.

A node should not be configured as both input and output node at the same time. When "TRINx" pin is set to logic '1', "TROUTx/x_CNTRL" pin should be set to logic '0' and vice versa. Otherwise said neuron will run into situation where it self-loops said electrical data signal at node 'x'. To avoid accidental self-looping of signal inside a node, said invention has an inverter circuit that connects between pins "TRINx" and "TROUTx/x_CNTRL".

Each node consists of six sub-systems that are explained below:
1. A buffer circuit is built with an OPAMP. Said buffer circuit accepts said electrical data input signal from a source and isolates said source from said node's internal signaling. It also helps prevent DC level from the below mentioned potential divider circuit to leak into output of said node.
2. A potential divider circuit is built to provide a DC level as an input to an adder circuit. It provides a baseline DC level to channels even when there is no source electrical data signal present. This DC baseline helps keep the silicon-controlled rectifiers to stay in 'ON' state and hence keep formed channel active. Said invention channels can get erased even when said electrical data signal is not present. To avoid this, said potential divider circuit is built in said invention.
3. Built with an OPAMP, an adder circuit adds above said DC level voltage to said incoming electrical data signal. Said electrical data signal is thus raised above its own voltage level.
4. An inverter circuit, built with OPAMP, prevents any accidental self-looping of electrical data signals in a particular node. If "TRINx" and "TROUTx/x_CNTRL" pins for node 'x' are set to logic '1', then said input electrical data signal is fed to the output of said node. Said output in turn is fed to said input the same node thus causing self-looping of said electrical signal in that node. Said inverter circuit helps avoid this situation. Said inverter circuit is disabled by default. It is enabled by setting a pin called "MODESEL" pin to logic '1'.
5. Input silicon-controlled rectifier is used to configure a node as input. It is controlled with "TRINx" pin or said inverter circuit for that node. If said "MODESEL" pin of said invention is set to logic '1', then said input silicon-controlled rectifier is controlled by said inverter circuit. Otherwise, pin "TRINx" controls it.
6. Output silicon-controlled rectifier is used to configure a node as output. It is controlled with "TROUTx/x_CNTRL" pin of that node.

Figure 3:
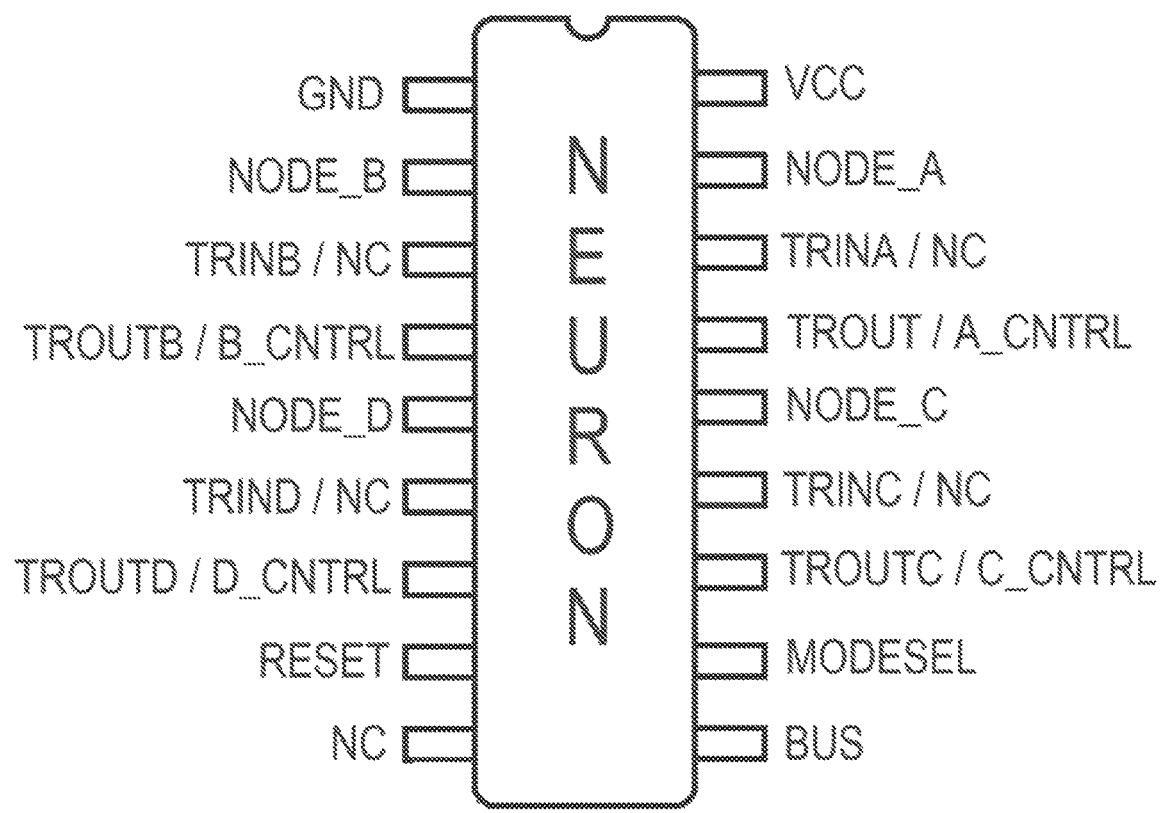
FIG. 3. Integrated circuit of said invention.
Figure 4:
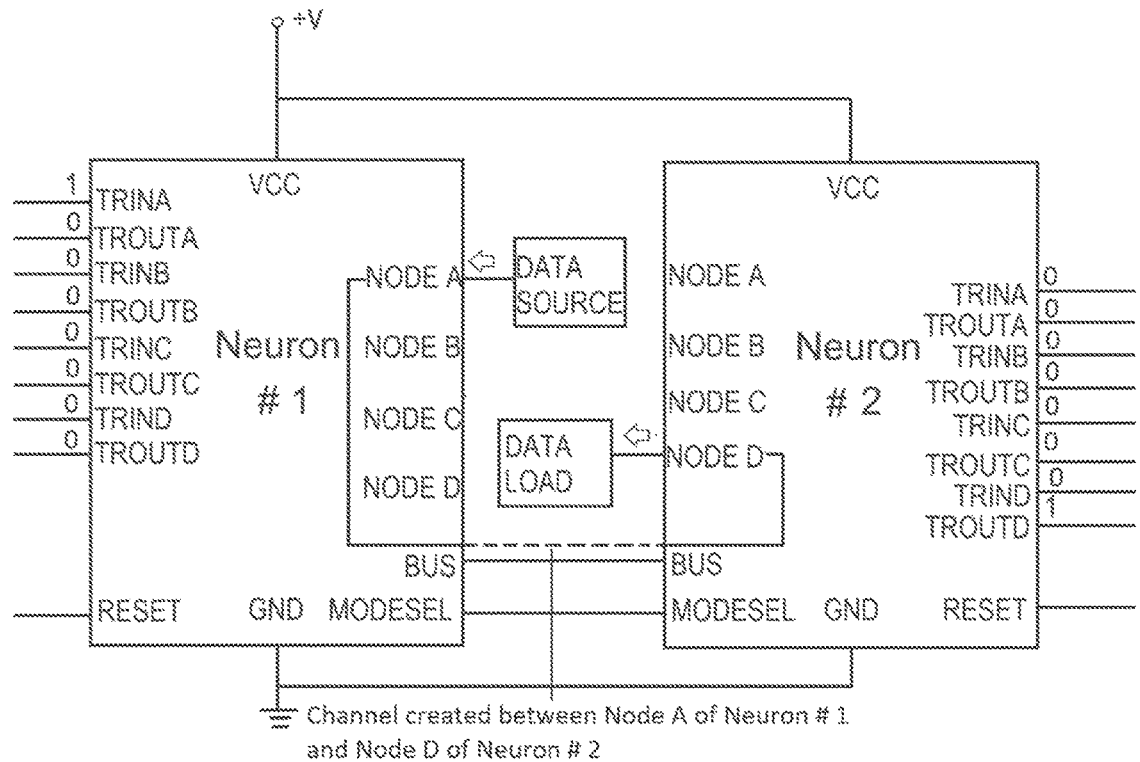
FIG. 4. Combining two units of said invention to form a bigger unit.

Said invention can be embedded in an integrated circuit as shown in FIG. 3 of "Invention Drawings" document. Said integrated circuit will have 17 usable pins and 1 "no connection" pin. The "GND" and "VCC" pins connects to power supply. "NODE_A", "NODE_B", "NODE_C" and "NODE_D" pins carry said electrical data signal for node A, node B, node C and node D respectively. "TRINA/NC", "TRINB/NC", TRINC/NC" and "TRIND/NC" pins help make the respective node can input node. "TROUTA/A_CNTRL", "TROUTB/B_CNTRL", "TROUTC/C_CNTRL" and "TROUTD/D_CNTRL" pins help make the respective node an output node. "MODESEL" pin enables said inverter circuit to avoid self-looping inside a node. "RESET" pin helps break a previously established connection between two nodes. "BUS" pin helps to expand the number of nodes by concatenating two units of said invention as shown in FIG. 4 of "Invention Drawings" document.

Concatenation of two units of said invention creates a bigger unit of said invention. The number of nodes get added. In this scenario, "BUS" and "MODESEL" pins of both units are connected. With two units, now there are 8 nodes. "TRINA" pin of neuron #1 and "TROUTD/D_CNTRL" pin of neuron #2 is set to logic 1. This creates a channel between node A of neuron #1 as input node and node D of neuron #2 as output node. Multiple units of said invention can be concatenated in a similar way by connecting "BUS" and "MODESEL" pins of all the said units to form a bigger unit of said invention.

Figure 5:
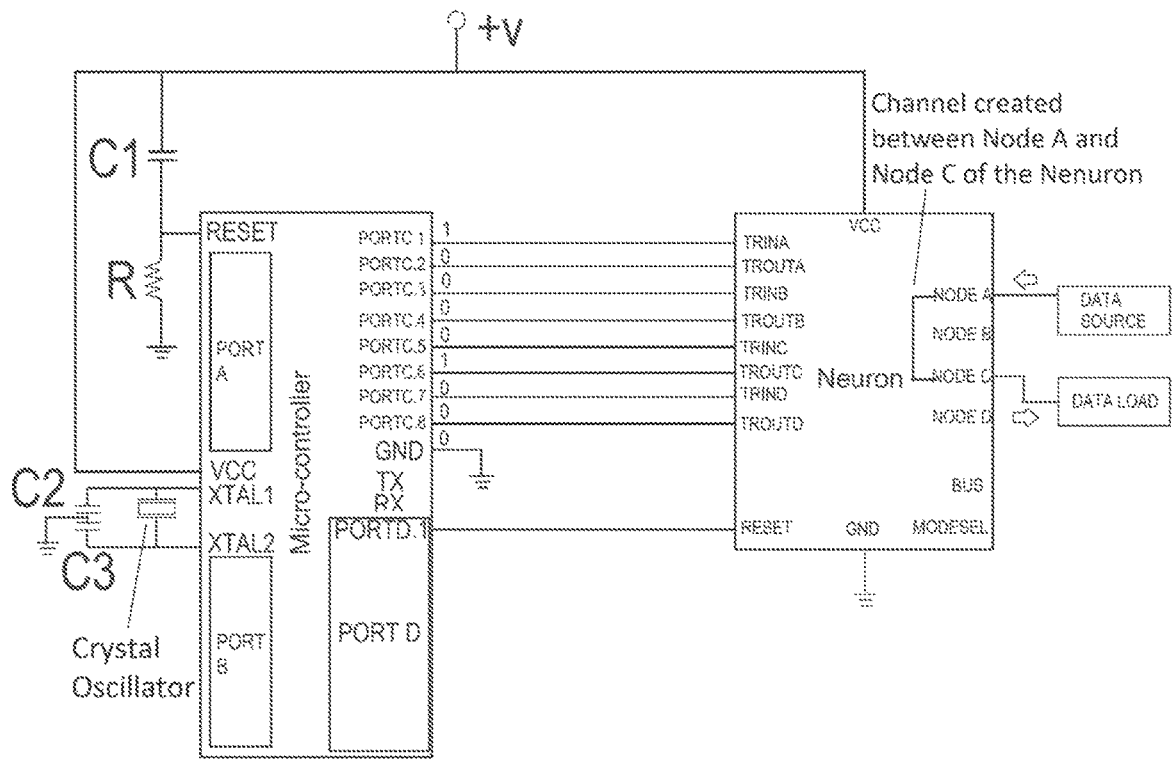
FIG. 5. Application wherein said invention is being controlled by a micro-controller.

A sample application circuit diagram of said invention being controlled by a micro-controller is shown in FIG. 5 of "Invention Drawings" document. Port "C" of said micro-controller is connected to control pins of said invention. Node A of said invention is configured as input node by "PORTC.1" pin of said micro-controller which is transmitting logic 1 to "TRINA" pin of said invention. Node C of said invention is configured as output node by "PORTC.6 pin of said micro-controller which is transmitting logic 1 to "TROUTC/C_CNTRL" pin of said invention. Thus, a channel from node A to node C is established.

The invention claimed is:
1. A circuit comprising:
    four buffer circuits, four adder circuits, four inverter circuits, four potential divider circuits, eight silicon-controlled rectifiers and one transistor that are connected to each other.
2. The circuit as in claim 1, wherein output of each said buffer circuit is connected to input of one of said adder circuits, output of which is connected to anode terminal of one of said silicon-controlled rectifiers; and
    output of one of said logic inverter circuits is connected to gate terminal of said silicon-controlled rectifier; and cathode terminal of said silicon-controlled rectifier is connected to anode terminal of another one of silicon-controlled rectifiers to form a sub-bus; and output of one of said potential divider circuits is also connected to input of said adder circuit.

3. The circuit as in claim 2, wherein four sub-buses are connected together to form a bus; and said bus is connected to collector terminal of said transistor.

4. The circuit as in claim 1, wherein each one of said buffer circuits is built with OPAMP by connecting output terminal to inverting terminal of said OPAMP; and a resistor of 470 ohms connected between non-inverting terminal of said OPAMP and electrical ground.

5. The circuit as in claim 1, wherein each one of said adder circuits is built with OPAMP by connecting a 11 Kohm resistor between output terminal and said inverting terminal of said OPAMP; and connecting a 10 Kohm resistor between said inverting terminal of said OPAMP and said electrical ground; and connecting a 470 Kohm resistor between said output of said buffer circuit and non-inverting terminal of said OPAMP; and connecting a 620 Kohm resistor between said non-inverting terminal of said OPAMP and said electrical ground.

6. The circuit as in claim 1, wherein each one of said inverter circuits is built with OPAMP by connecting a 620 Kohm resistor between Vcc terminal and inverting terminal of said OPAMP; and connecting a 620 Kohm resistor between inverting terminal and non-inverting terminal of said OPAMP; and connecting a 620 Kohm resistor between non-inverting terminal and electrical ground of said invention.

7. The circuit as in claim 1, wherein each one of said potential divider circuits is built by connecting a 1 Meg ohm resistor in series with 560 Kohm resistor between Vcc terminal and electrical ground; and connecting a 22 Kohm resistor between electrical junction formed by said 1 Meg ohm resistor and said 560 Kohm resistor and non-inverting terminal of said OPAMP of said adder circuit.

8. The circuit as in claim 1, wherein gate terminal of each one of said silicon-controlled rectifiers is connected to one terminal of a 47 Kohm resistor.

9. The circuit as in claim 1, wherein said transistor is NPN type switching transistor.

* * * * *